(12) United States Patent
Wu

(10) Patent No.: US 7,629,848 B2
(45) Date of Patent: Dec. 8, 2009

(54) OPERATIONAL AMPLIFIER WITH EXTENDED COMMON-MODE INPUT RANGE

(75) Inventor: Stephen Wu, Fountain Valley, CA (US)

(73) Assignee: Broadcom Corporation, Irvine, CA (US)

( * ) Notice: Subject to any disclaimer, the term of this patent is extended or adjusted under 35 U.S.C. 154(b) by 590 days.

(21) Appl. No.: 11/483,016

(22) Filed: Jul. 7, 2006

(65) Prior Publication Data
US 2009/0039958 A1    Feb. 12, 2009

(51) Int. Cl.
*H03F 3/45* (2006.01)
(52) U.S. Cl. .................. 330/258; 330/260; 330/257
(58) Field of Classification Search .......... 330/258, 330/260, 257
See application file for complete search history.

(56) References Cited

U.S. PATENT DOCUMENTS 5,212,455 A * 5/1993 Pernici et al. ............... 330/253
6,525,608 B2 * 2/2003 Krupnik ..................... 330/253
6,784,500 B2 * 8/2004 Lemkin ...................... 257/368
6,930,545 B2 * 8/2005 Kwan et al. .................. 330/9
7,365,600 B1 * 4/2008 Lokere ....................... 330/258
7,489,186 B2 * 2/2009 Segarra ......................... 330/2

* cited by examiner

*Primary Examiner*—Patricia Nguyen
(74) *Attorney, Agent, or Firm*—Garlick Harrison & Markison; Bruce E. Garlick

(57) ABSTRACT

An operational amplifier is provided with an extended common mode input range. This operational amplifier includes an input stage, a common mode feedback circuit, a current mirror, a replica input stage, and an output stage. The input stage couples to the CMFB circuit and replica input stage. The input stage is operable to receive a feedback signal from the CMBF circuit. This feedback signal is based on comparing a common mode voltage to a common mode reference voltage. The current mirror, coupled to the CMFB circuit and input stage, mirrors currents within the input stage as input to the CMFB circuit. The replica input stage, which is also coupled to the CMFB circuit, uses an input common mode (INCM) voltage to adjust current flow within the replica input stage. This allows a current within the CMFB circuit to be a function of the INCM. The output stage couples to the input stage and is operable to provide an amplified signal corresponding to a first differential signal.

20 Claims, 8 Drawing Sheets

OPERATIONAL AMPLIFIER WITH EXTENDED COMMON-MODE INPUT RANGE

CROSS REFERENCE TO RELATED APPLICATIONS

This application is related to application Ser. No. 10/823,732 entitled "OPERATIONAL AMPLIFIER WITH INCREASED COMMON-MODE INPUT RANGE," filed on Apr. 14, 2004, which is incorporated by reference for all purposes.

TECHNICAL FIELD OF THE INVENTION

The present invention relates generally to operational amplifiers, and more particularly, to operational amplifiers with extended common mode input range.

BACKGROUND OF THE INVENTION

The desire to integrate many circuits, both analog and digital, onto a single IC means using CMOS technologies with very small geometries. As transistor sizes shrink, more circuits can be integrated using the same amount of silicon area. However, as the transistor size shrinks, so does the maximum voltage across which the devices can safely operate. As the supply voltage approaches the signal amplitude, the challenges in circuit design increase dramatically.

Prior technology uses complementary inputs (PMOS and NMOS) to extend the input range, which results in variations in the input transconductance across the input CM range. This affects design paramters such as gain, speed, and noise. Additionally, this requires matching of device parameters across process and temperature. Given a specific supply voltage, a common-mode input range (CMIR) is defined as the range of input voltages over which the circuit can operate correctly. The required CMIR may include much of the available supply voltage.

The operational amplifier (OPAMP) is a basic building block utilized in many analog and mixed-signal systems. The OPAMP is a high-gain differential amplifier. Critical design parameters include: gain, frequency response, output swing, linearity, noise offset, supply rejection, common-mode feedback, and slew rate. In many applications the common-mode input level to the OPAMP will vary over a wide range. The design parameters should be satisfied over the entire common-mode input range of the OPAMP. Thus one would desire to extend the common-mode input range of an OPAMP such that the design parameters do not degrade within this extended range.

Many operational amplifiers (op amps) use rail-to-rail circuit techniques which allows the CMIR to include the entire supply voltage. These topologies often employ two input stages, one for operation near each supply voltage. One input stage will use a PMOS differential pair and the other will use a NMOS differential pair. Because the transconductances of these two input pairs are not matched and will not track each other over process variations, the linearity of the overall amplifier is degraded, and high performance is difficult to achieve.

Another op amp topology often chosen for it's high CMIR is the folded-cascode topology. The folded-cascode circuit often allows the common mode input voltage to reach the negative supply, usually ground in low supply voltage circuits, without any problems. However, in unity gain buffer configurations, where the inverting op amp input is tied to the output, it is the output which will limit the voltage swing.

Although the linearity of the folded-cascode op amp is better than the typical rail-to-rail designs, it still has linearity problems. As the common mode input voltage changes, which will in turn change the gain of the stage. The stage gain varies as a function of the input stage transconductance times the output resistance.

SUMMARY OF THE INVENTION

Embodiments of the present invention are directed to systems and methods that are further described in the following description and claims. Advantages and features of embodiments of the present invention may become apparent from the description, accompanying drawings and claims.

BRIEF DESCRIPTION OF THE DRAWINGS

For a more complete understanding of the present invention and the advantages thereof, reference is now made to the following description taken in conjunction with the accompanying drawings in which like reference numerals indicate like features and wherein.

DETAILED DESCRIPTION OF THE INVENTION

Preferred embodiments of the present invention are illustrated in the FIGURES, like numerals being used to refer to like and corresponding parts of the various drawings.

Figure 1:
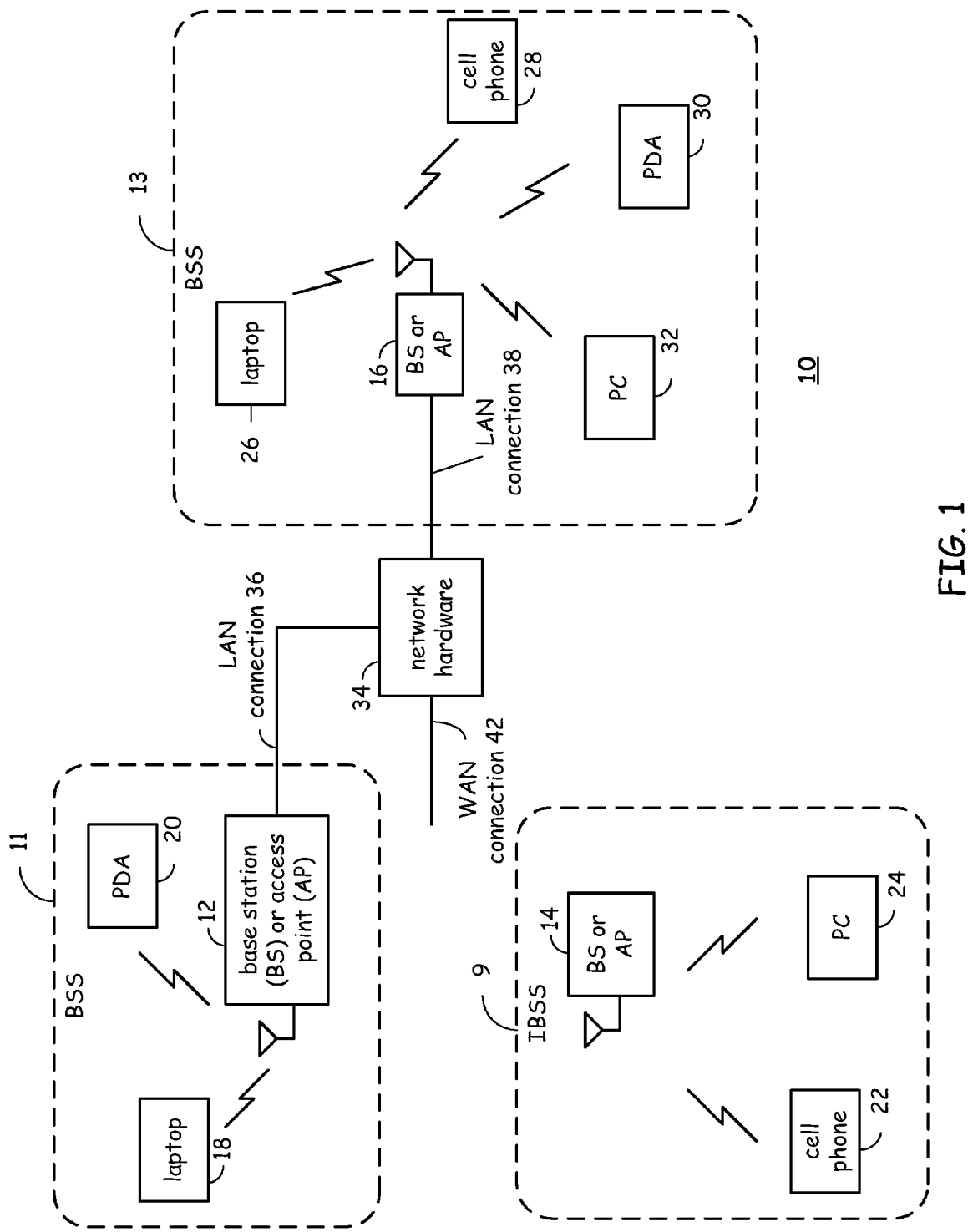
FIG. 1 is a schematic block diagram of a wireless communication system in accordance with the present invention.

FIG. 1 is a schematic block diagram illustrating a communication system 10 that includes a plurality of base stations and/or access points 12-16, a plurality of wireless communication devices 18-32 and a network hardware component 34. The wireless communication devices 18-32 may be laptop host computers 18 and 26, personal digital assistant hosts 20 and 30, personal computer hosts 24 and 32 and/or cellular telephone hosts 22 and 28. The details of the wireless communication devices will be described in greater detail with reference to FIG. 2.

The base stations or access points 12-16 are operably coupled to the network hardware 34 via local area network connections 36, 38 and 40. The network hardware 34, which may be a router, switch, bridge, modem, system controller, et cetera, provides a wide area network connection 42 for the communication system 10. Each of the base stations or access points 12-16 has an associated antenna or antenna array to communicate with the wireless communication devices in its area. Typically, the wireless communication devices register with a particular base station or access point 12-14 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio. The radio includes a highly linear amplifier and/or programmable multi-stage amplifier as disclosed herein to enhance performance, reduce costs, reduce size, and/or enhance broadband applications.

Each of the wireless communication devices of FIG. 1 may include a number of integrated circuits and operational amplifiers (OPAMPs). The operational amplifier (OPAMP) is a basic building block utilized in many analog and mixed-signal systems. The OPAMP is a high-gain differential amplifier. Critical design parameters include: gain, frequency response, output swing, linearity, noise offset, supply rejection, common-mode feedback, and slew rate. In many applications the common-mode input level to the OPAMP will vary over a wide range. The design parameters should be satisfied over the entire common-mode input range of the OPAMP. This invention describes techniques used to extend the common-mode input range of an OPAMP such that the design parameters do not degrade within this extended range.

The design parameters of the OPAMP should be satisfied over the entire common-mode input range of the OPAMP. Prior technology uses complementary inputs (PMOS and NMOS) to extend the input range, which results in variations in the input transconductance across the input CM range. This affects design paramters such as gain, speed, and noise. Additionally, this requires matching of device parameters across process and temperature.

Embodiments of the present invention provide techniques used to extend the common-mode input range (CMIR) of an OPAMP such that the design parameters do not degrade within this extended range. This improved functionality may be achieved by adjusting the cascode biasing and common-mode feedback (CMFB) as a function of the input common-mode level. By adjusting the cascode biasing and CMFB to extend the input common-mode range, the operational frequency of the OPAMP is not affected. As a result the key design parameters (gain, frequency response, output swing, linearity, noise offset, supply rejection, common-mode feedback, and slew rate) remain at a constant, optimal level for a wider operational common-mode input range.

Various embodiments of the present invention may utilize an N-MOS or a P-MOS input stage, depending upon the desired input range. The OPAMP provided by the various embodiments of the present invention may serve as a basic analog building block which may be utilized in applications requiring strict control over design parameters over a large input common-mode range. The cascode biasing technique may be used in any circuit utilizing cascode biasing to maintain the proper biasing independent of process variation.

Figure 2:
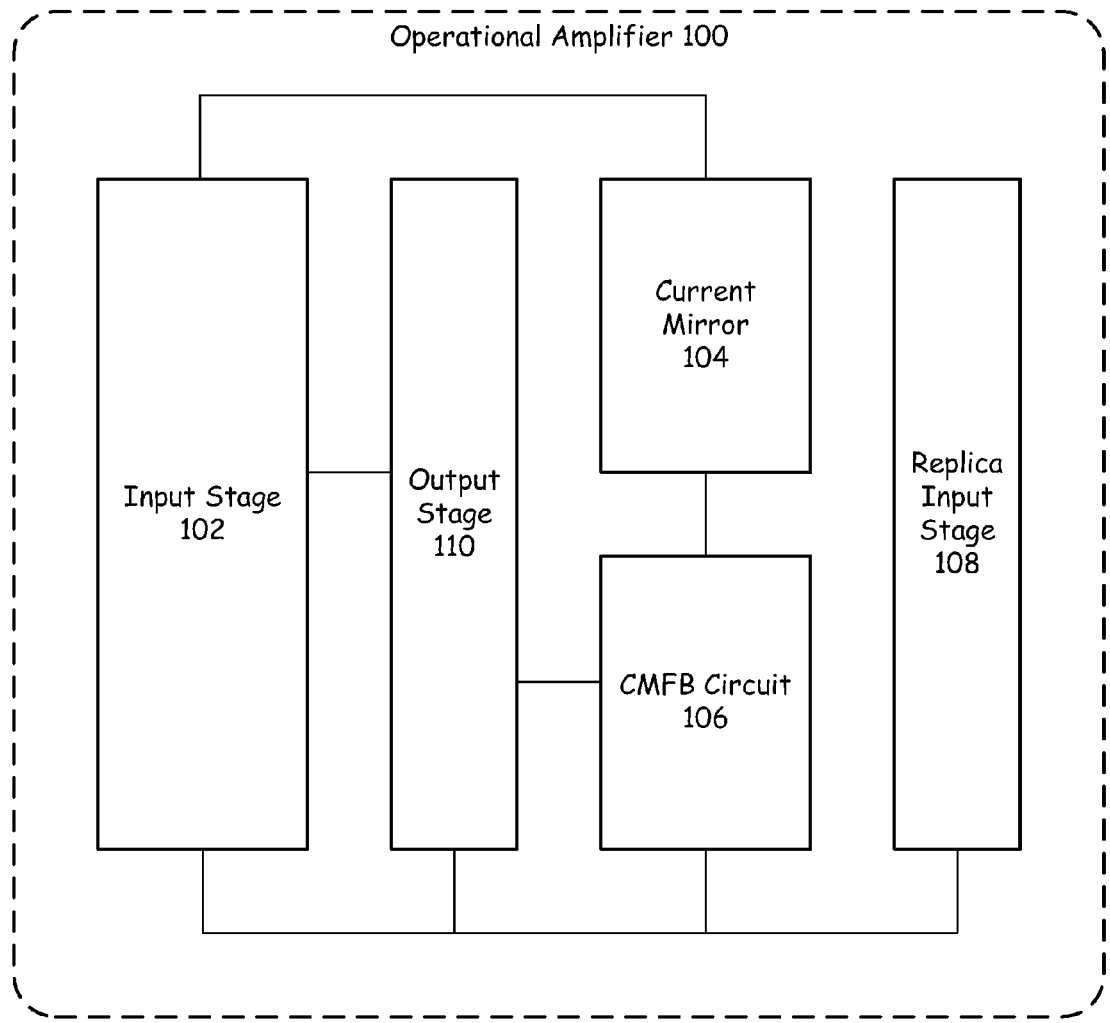
FIG. 2 provides a functional block diagram of an operational amplifier in accordance with an embodiment of the present invention.

FIG. 2 provides a functional block diagram of an OPAMP having an extended common mode input range (CMIR). This OPAMP includes an input stage, a common mode feedback (CMFB) circuit, a current mirror, a replica input stage, and an output stage. Input stage couples to the CMFB circuit, replica input stage, current mirror, and output stage, and receives a feedback signal from the CMFB circuit. This feedback signal is based on comparing a common mode voltage (VCM) to a common mode reference voltage. The current mirror, coupled to the CMFB circuit and input stage, mirrors currents within the input stage as input to the CMFB circuit. The replica input stage, which is also coupled to the CMFB circuit, uses an input common mode (INCM) voltage to adjust current flow within the replica input stage. This allows a current within the CMFB circuit to be a function of the INCM. The output stage couples to the input stage and is operable to provide output voltages for the OPAMP.

FIG. 2 provides a block diagram illustrating the various functional elements of an OPAMP 100 in accordance with an embodiment of the present invention. OPAMP 100 includes input stage 102, current mirror 104, common mode feedback circuit 106, replica input stage 108 and an output stage 110. Input stage 102 couples to the CMFB circuitry 106, replica input stage 108, current mirror 104, and output stage 110, and receives a feedback signal from the CMFB circuitry 106. The details of these circuit elements will be discussed in further detail with reference to FIGS. 3, 4, and 5.

Figure 3:
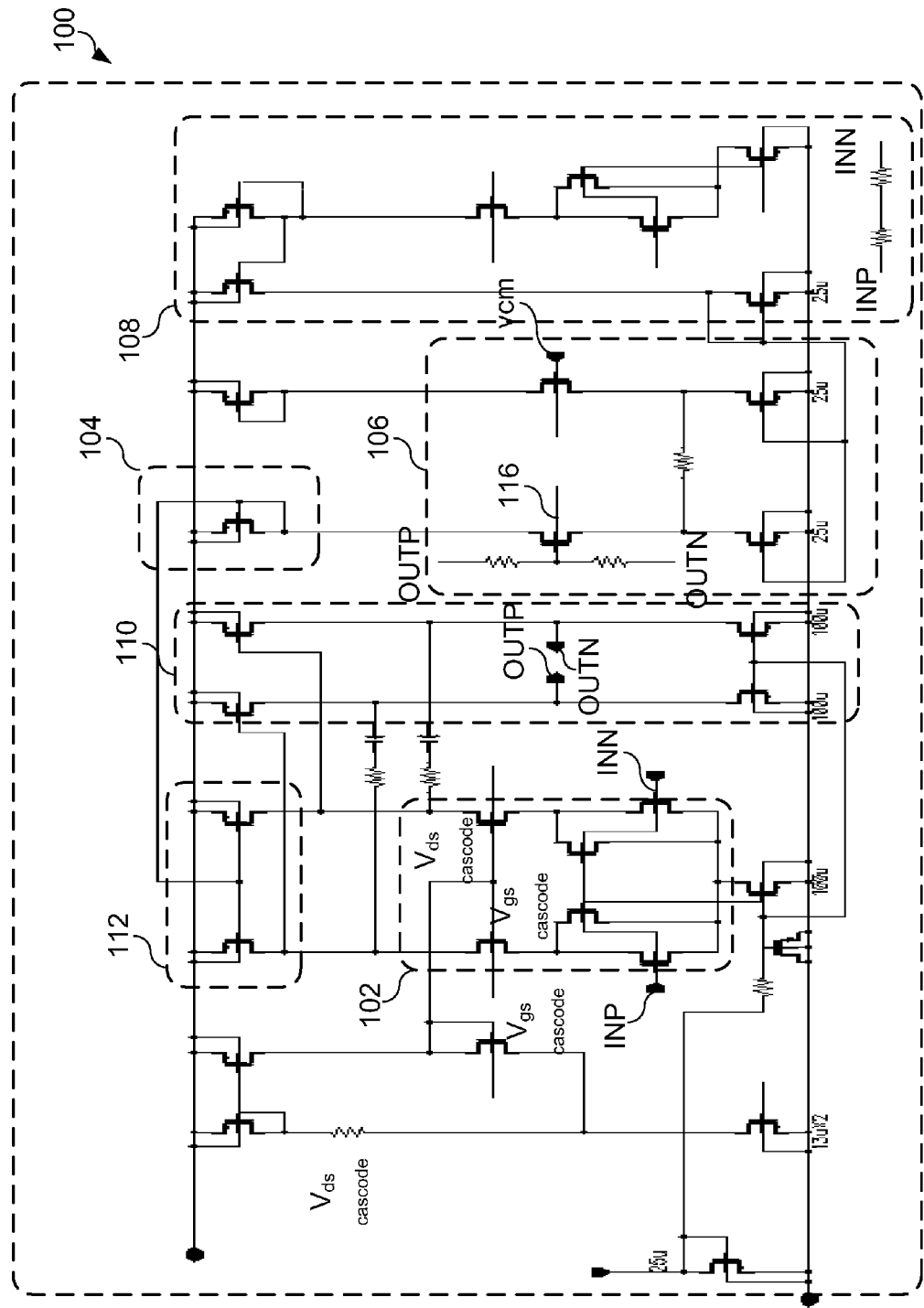
FIG. 3 more specifically illustrates an operational amplifier in accordance with an embodiment of the present invention.
Figure 4:
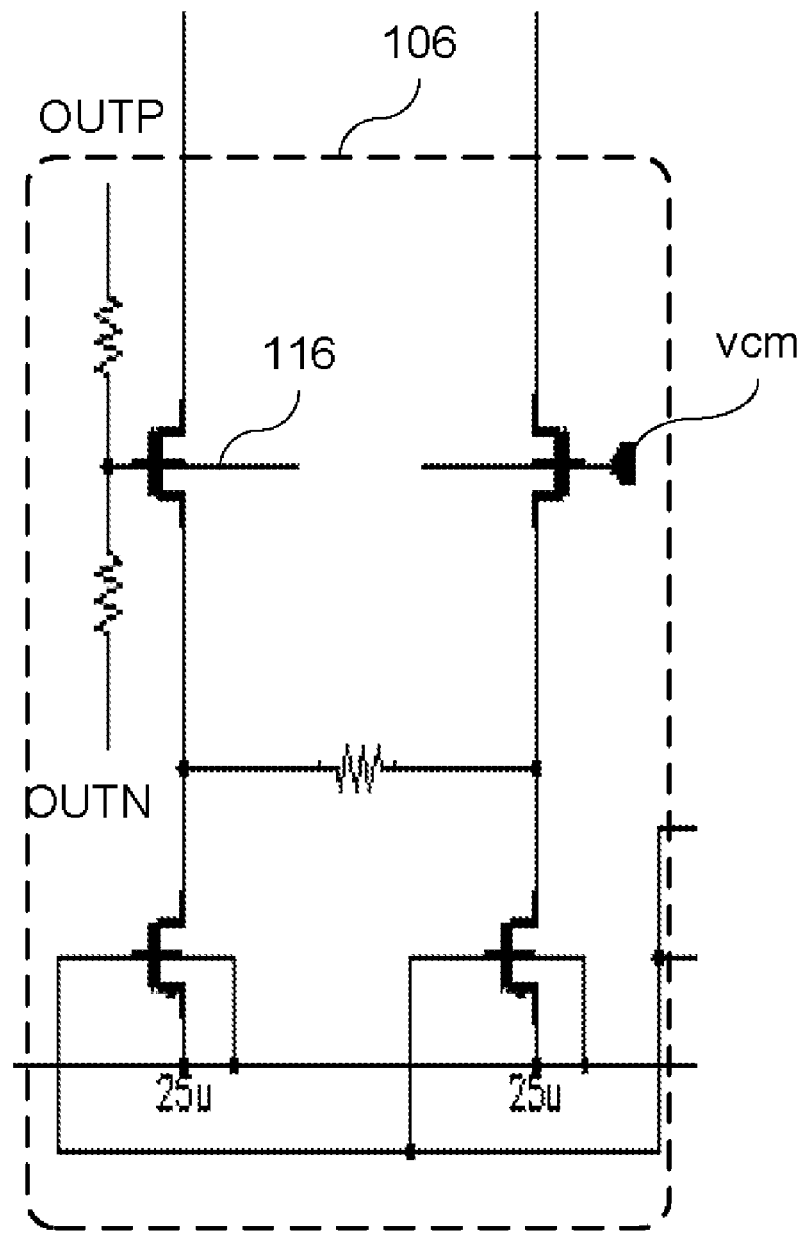
FIG. 4 depicts common mode feedback circuitry within an operational amplifier in accordance with an embodiment of the present invention.

FIG. 3 depicts an electrical schematic of OPAMP 100 in accordance with an embodiment of the present invention. FIG. 4 depicts common mode feedback circuitry within an operational amplifier in accordance with an embodiment of the present invention. A resistor network 114 which is more clearly shown in FIG. 4 is located between nodes OUTN and OUTP and allows the average voltage to be sensed at transistor 116. This may be used to compare the common mode voltage (CMV) to a reference voltage and force the CMV to the reference voltage.

Figure 5:
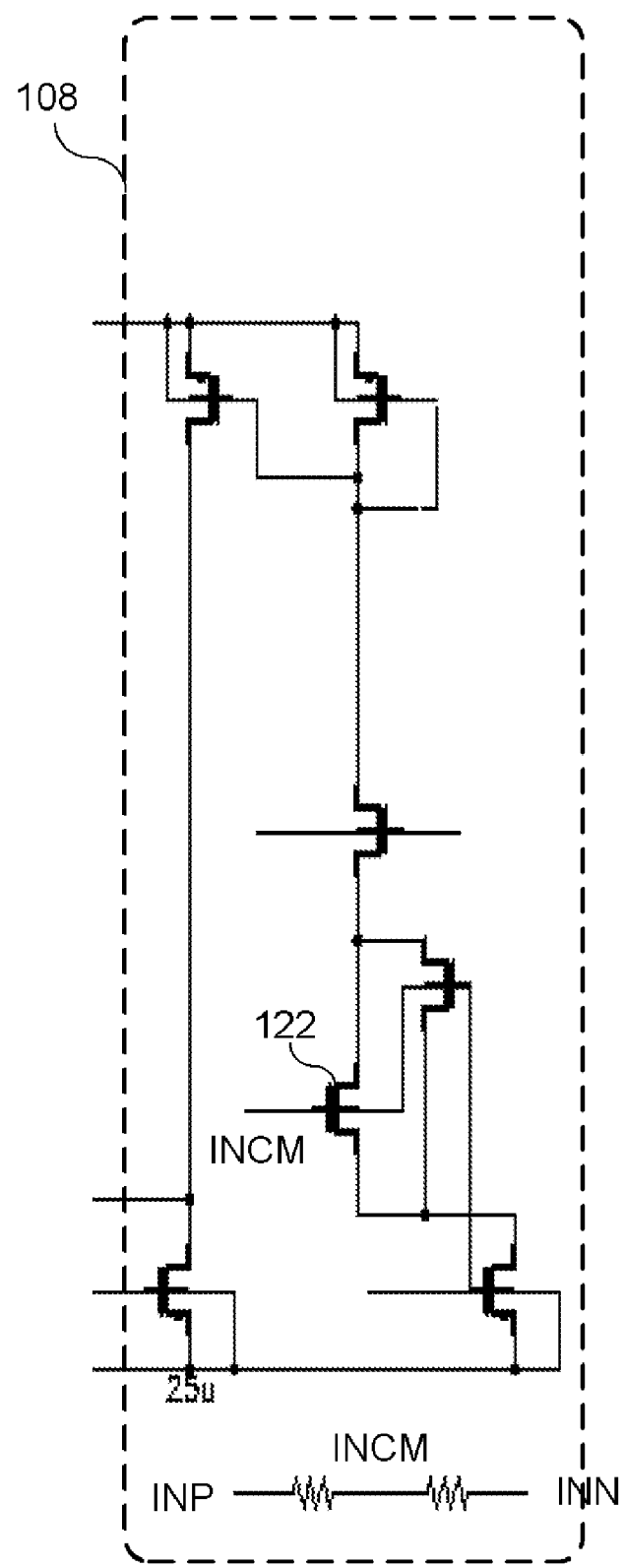
FIG. 5 depicts replica input stage circuitry within an operational amplifier in accordance with an embodiment of the present invention.

FIG. 5 depicts replica input stage circuitry within an operational amplifier in accordance with an embodiment of the present invention. By adding replica input stage 108 as detailed in FIG. 5, resistor network 120 is coupled to node INP and INN and the average voltage between these nodes may be sensed as INCM to be used to bias transistor 122 within replica input stage 108. Thus, transistor 122 is biased as the average voltage between INP and INN (i.e. the DC common mode level of the input (INCM)). The rate that the current varies is a function of Vds. As INCM varies, this will affect the voltage of the drain at transistor 122 within the replica input stage. Thus, the amount of current feeding back via the CMFB circuitry is actually a function of the INCM. Thus, the common mode can affect a drain voltage. To limit those effects current mirror 104 functions as an input to the CMFB circuitry such that the voltage feedback becomes a function of the input voltage.

Figure 6:
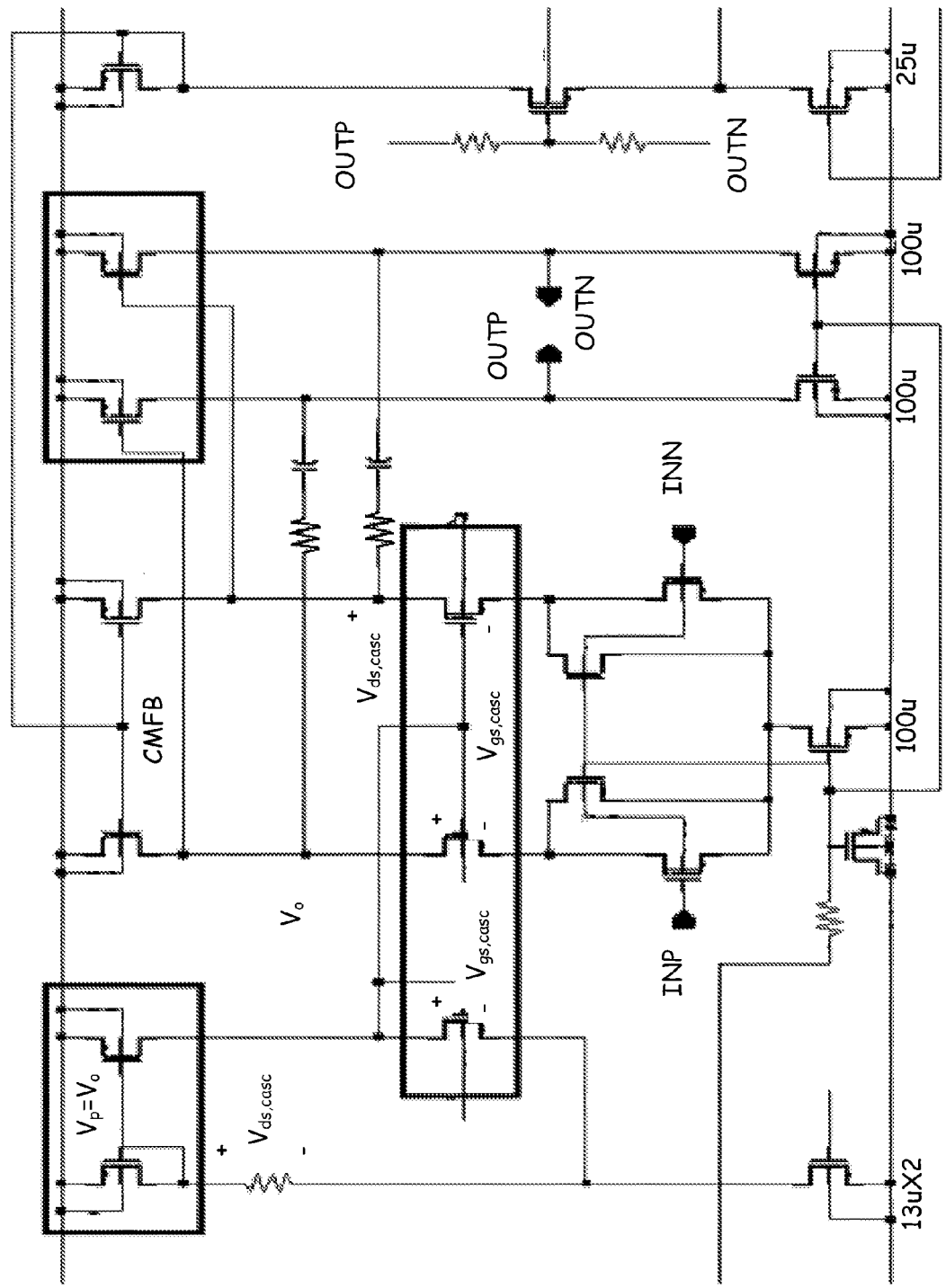
FIG. 6 illustrates an operational amplifier in accordance with an embodiment of the present invention.

FIG. 6 depicts an electrical schematic of OPAMP 100 in accordance with an embodiment of the present invention having specific values associated with the various circuit elements and current paths.

Figure 7:
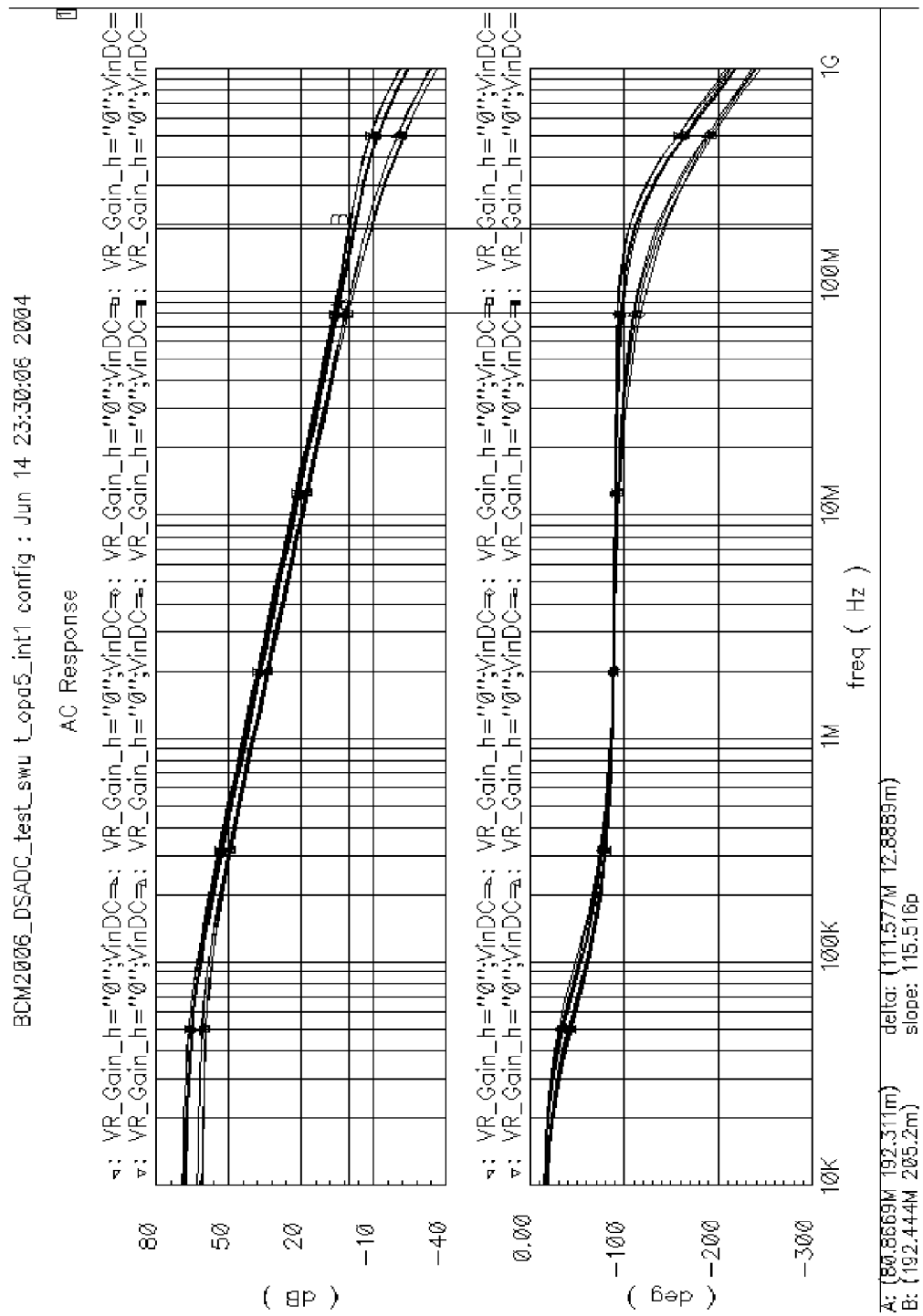
FIG. 7 illustrates a graph showing improvement in common mode input range using the present invention.
Figure 8:
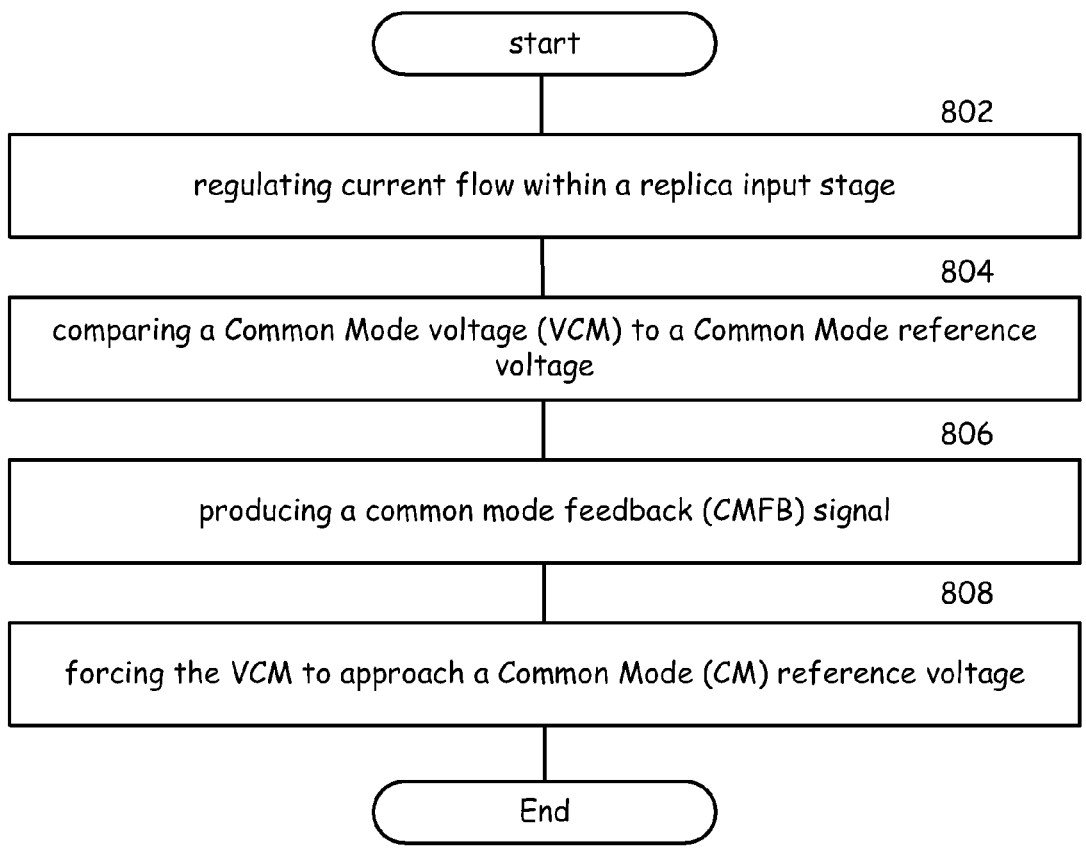
FIG. 8 provides a logic flow diagram in accordance with an embodiment of the present invention.

As shown in FIG. 7, OPAMP 100 has a high gain (greater than 60 DB) that may be maintained throughout a desired common mode input range CMIR. By adjusting the cascode biasing and common mode feedback as a function of the input common mode level, FIG. 6 shows experimental results that extend the CMIR without affecting the operational frequency of the op amp. As a result, key design parameters (gain, frequency response, output swing, linearity, noise offset, supply rejection, common-mode feedback, and slew rate) may remain at a constant optimal level for a wider operational CMIR.

OPAMPs as depicted in the figures may exhibit a gain that may be expressed as a function of an output impedance of the input stage ($R_{out\text{-}input}$). When the second stage transistors are cascoded, the gain of the cascoded OPAMP may be expressed as a function of an output impedance of the input stage ($R_{out\text{-}input}$) multiplied by an output impedance of the cascoded device ($R_{out\text{-}cascode}$).

Returning to FIG. 3, a well defined current is observed within resistor R1. The voltage across the resistor is actually the drain source voltage of the transistor. By choosing the VDS such that the overall process and temperature saturation condition is satisfied with the minimum possible margin resulting in the widest possible range of the out path. Once this condition is not satisfied, the input transistor does not operate in saturation in the gain drops. The expected high gain is not available. These parameters of the VDS may vary as function of the processing, the fabrication processes associated with building the transistor. Temperature means the actual temperature that the transistor is exposed to during operation while process means process variations in the fabrication of the transistor. These parameters vary with both temperature and process. Thus the circuit provided by the present invention allows the output to be stabilized over a wide range of operating conditions as well as fabrication processes. Additionally, this ensures in addition to temperature processes but as the input voltage supply decreases over time by having a system such as provided by embodiments of the present invention voltage supply be reduced further before operation of the circuit. Embodiments of the present invention allow the temperature to vary without impacting the operations of the OPAMP.

The OPAMP is well known in the art. The gain of conventional amplifier stages varies with output voltage often resulting in distortion and nonlinearity. In practical video applications, it is desirable to have at least 100 bits of linearity. It is more desirable to have at least 70 dB of linearity, which corresponds to 11-12 bits. It is also desirable to design a circuit using plain CMOS technology, and to have a circuit that has low power, low area, low noise, high linearity and high swing. Differential pair transistors cannot accomplish it alone.

There is no commonly accepted definition for an op amp's common mode-input range (CMIR) where high linearity will be obtained. What is usually specified is the minimum and maximum DC voltages which the amplifier can attain. However, signals may be distorted well before these voltages are reached. Over some CMIR, if an amplifier stage's gain remains constant at the signal frequency of interest, that stage will not contribute to an amplifier's overall distortion if the signal amplitude stays within the CMIR.

In summary, embodiments of the present invention provide an OPAMP having an extended CMIR and provide techniques used to extend the CMIR of an OPAMP such that the design parameters do not degrade within this extended range. This improved functionality may be achieved by adjusting the cascode biasing and common-mode feedback (CMFB) as a function of the input common-mode level. By adjusting the cascode biasing and CMFB to extend the input common-mode range, the operational frequency of the OPAMP is not affected. As a result the key design parameters (gain, frequency response, output swing, linearity, noise offset, supply rejection, common-mode feedback, and slew rate) remain at a constant, optimal level for a wider operational common-mode input range.

The OPAMP includes an input stage, a common mode feedback (CMFB) circuit, a current mirror, a replica input stage, and an output stage. Input stage couples to the CMFB circuit, replica input stage, current mirror, and output stage, and receives a feedback signal from the CMFB circuit. This feedback signal is based on comparing a common mode voltage (VCM) to a common mode reference voltage. The current mirror, coupled to the CMFB circuit and input stage, mirrors currents within the input stage as input to the CMFB circuit. The replica input stage, which is also coupled to the CMFB circuit, uses an input common mode (INCM) voltage to adjust current flow within the replica input stage. This allows a current within the CMFB circuit to be a function of the INCM. The output stage couples to the input stage and is operable to provide an amplified signal corresponding to a first differential signal.

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

Although the present invention is described in detail, it should be understood that various changes, substitutions and alterations can be made hereto without departing from the spirit and scope of the invention as described by the appended claims.

What is claimed is:

1. An operational amplifier operable to provide an extended Common Mode Input Range (CMIR), the operational amplifier comprising:
   an input stage coupled to the CMFB circuit and a replica input stage, wherein the input stage is operable to receive a feedback signal;
   a common mode feedback (CMFB) circuit operable to compare a Common Mode voltage (VCM) to a Common Mode (CM) reference voltage and provide the feedback signal;
   a current mirror coupled to the CMFB circuit and the input stage, wherein the current mirror is operable to mirror currents within the input stage as inputs to the CMFB circuit;
   a replica input stage coupled to the CMFB circuit operable to compare an input common mode (INCM) voltage to a Common Mode reference voltage, wherein a current within the CMFB circuit is a function of the INCM voltage; and
   an output stage coupled to the input stage.

2. The operational amplifier of claim 1, wherein the CMFB circuit further comprises a resistor network operable to produce the VCM as an average of an output P (OUTP) voltage and an output N (OUTN) voltage.

3. The operational amplifier of claim 2 wherein a second resistor network couples to the replica input stage and is operable to provide the input common mode (INCM) voltage as an average of an input P (INP) voltage and an input N (INN) voltage.

4. The operational amplifier of claim 1, wherein the gain of the operational amplifier may be expressed as a function of an output impedance of the input stage ($R_{out\text{-}input}$).

5. The operational amplifier of claim 1, wherein CMFB circuit forces the VCM to the CM reference voltage.

6. The operational amplifier of claim 1, wherein having the INCM voltage as a function of the current within the CMFB circuit forces the VCM to the CM reference voltage and results in an extended CMIR.

7. The operational amplifier of claim 1, wherein a second stage of transistors are cascoded above the input stage.

8. The operational amplifier of claim 7, wherein the cascoded second stage of transistors boosts a gain of the operational amplifier.

9. The operational amplifier of claim 7, wherein the gain of the operational amplifier may be expressed as a function of an output impedance of the input stage ($R_{out\text{-}input}$) multiplied by an output impedance of the cascoded device ($R_{out\text{-}cascode}$).

10. The operational amplifier of claim 1, wherein transistors of the operational amplifier comprise N-MOS and/or P-MOS transistors.

11. A method to provide an extended Common Mode Input Range (CMIR) for an operational amplifier, the method comprising:
    regulating current flow within a replica input stage based on an input common mode (INCM) voltage;
    comparing a Common Mode voltage (VCM) to a Common Mode (CM) reference voltage;
    producing a common mode feedback (CMFB) signal to an input stage of the operational amplifier, wherein the CMFB signal is based on the comparison of the VCM and Common Mode reference voltage, and wherein the CMFB signal is a function of an input common mode (INCM) voltage; and
    forcing the VCM to approach the Common Mode (CM) reference voltage.

12. The method of claim 11, further comprising current mirroring currents within the input stage as an input to CMFB circuitry.

13. The method of claim 11, further comprising producing the VCM with a resistor network operable to produce the VCM as an average of an output P (OUTP) voltage and an output N (OUTN) voltage.

14. The method of claim 11, further comprising producing the INCM voltage with a resistor network as an average of an input P (INP) voltage and an input N (INN) voltage.

15. The method of claim 11, wherein having the INCM voltage as a function of the current within a CMFB circuit forces the VCM to the CM reference voltage and results in an extended CMIR.

16. The method of claim 11, further comprising cascoding a second stage of transistors above the input stage.

17. The method of claim 16, wherein the cascoded second stage of transistors boosts a gain of the operational amplifier.

18. The method of claim 17, wherein the gain of the operational amplifier may be expressed as a function of an output impedance of the input stage ($R_{out\text{-}input}$) multiplied by an output impedance of a cascoded device ($R_{out\text{-}cascode}$).

19. The method of claim 11, wherein transistors of the operational amplifier comprise N-MOS and/or P-MOS transistors.

20. An operational amplifier operable to provide an extended Common Mode Input Range (CMIR), the operational amplifier comprising:
    an input stage coupled to a CMFB circuit and a replica input stage, wherein the input stage is operable to receive a feedback signal;
    a common mode feedback (CMFB) circuit operable to compare a Common Mode voltage (VCM) to a Common Mode (CM) reference voltage and provide the feedback signal, wherein the CMFB circuit comprises a resistor network operable to produce the VCM as an average of an output P (OUTP) voltage and an output N (OUTN) voltage, and wherein the CMFB circuit forces the VCM to the CM reference voltage and results in an extended CMIR;
    a current mirror coupled to the CMFB and the input stage, wherein the current mirror is operable to mirror currents within the input stage as inputs to the CMFB circuit;
    a replica input stage coupled to the CMFB circuit operable to compare an input common mode (INCM) voltage to the Common Mode reference voltage, wherein a current within the CMFB circuit is a function of the INCM voltage, and wherein a second resistor network couples to the replica input stage and is operable to provide the input common mode (INCM) voltage as an average of an input P (INP) voltage and an input N (INN) voltage;
    a second stage of transistors cascoded above the input stage, wherein the gain of the operational amplifier may be expressed as a function of an output impedance of the input stage ($R_{out\text{-}input}$) multiplied by an output impedance of a cascoded device ($R_{out\text{-}cascode}$); and
    an output stage coupled to the input stage.

* * * * *